Figure 1:
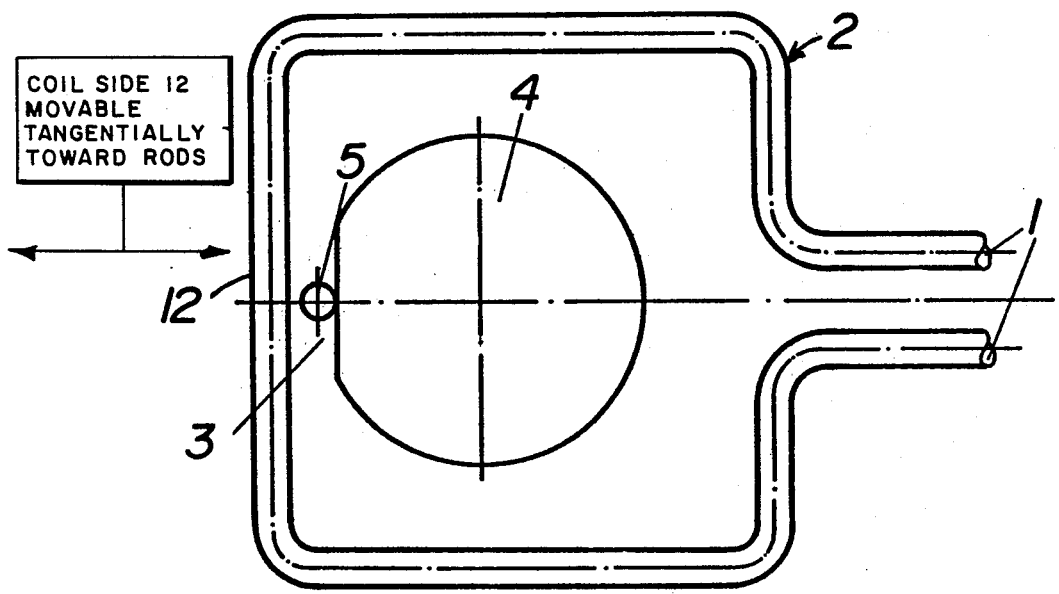

United States Patent [19]

Köhl et al.

[11] 4,110,586
[45] Aug. 29, 1978

[54] MANUFACTURE OF DOPED SEMICONDUCTOR RODS

[75] Inventors: Franz Köhl, Burghausen, Fed. Rep. of Germany; Walter Hoch, Neukirchen, Enknach, Austria

[73] Assignee: Wacker-Chemitronic Gesellschaft für Elektronik-Grundstoffe mbH, Burghausen, Fed. Rep. of Germany

[21] Appl. No.: 717,959

[22] Filed: Aug. 26, 1976

[30] Foreign Application Priority Data

Sep. 1, 1975 [DE] Fed. Rep. of Germany ....... 2538812

[51] Int. Cl.² .............................................. H05B 5/08
[52] U.S. Cl. ........................... 219/10.43; 13/DIG. 1; 23/273 SP; 156/605; 156/620
[58] Field of Search .............. 219/10.43, 10.79, 10.57, 219/6.5; 13/DIG. 1; 23/273 SP, 273 SPC, 273 Z, 300, 301; 156/620, 617, 605

[56] References Cited

U.S. PATENT DOCUMENTS

| | | | |
|---|---|---|---|
| 3,622,282 | 11/1971 | Keller | 219/10.79 |
| 3,685,973 | 8/1972 | Keller et al. | 13/DIG. 1 |
| 3,769,484 | 10/1973 | Stut et al. | 219/10.57 |
| 3,935,059 | 1/1976 | Ayel | 219/10.43 |
| 3,954,416 | 5/1976 | Keller | 23/273 SP |

Primary Examiner—Bruce A. Reynolds
Attorney, Agent, or Firm—Allison C. Collard

[57] ABSTRACT

Process for doping a semiconductor rod which comprises securing a semiconductor rod containing a dopant and having a substantially smaller cross section than the rod to be doped against said rod, with the axes of the two rods substantially parallel to one another, both rods consisting of the same semiconductor material, fusing the two rods into a single rod and subjecting the rod so formed to a crucible zone melting process either subsequently or simultaneously.

11 Claims, 2 Drawing Figures

MANUFACTURE OF DOPED SEMICONDUCTOR RODS

The present invention relates to a process for the manufacture of doped semiconductor rods, especially those of silicon.

A dopant, or doping substance, may be introduced into a semiconductor rod by a variety of methods. One such method (see German Pat. No. 1 056 840) involves introducing the dopant, which may be a donor or an acceptor, into holes, slots or other suitable apertures previously formed in the semiconductor rod. The rod may then be subjected to a zone-melting process in order to distribute the dopant uniformly throughout the rod. It is difficult, however, to produce rods by this method in which the resistance is sufficiently uniform throughout the rod to meet present day requirements. Moreover, growths can occur on the rod at the locations in which the dopant has been inserted and these may not couple up with the induction field of the heating coil used to melt the rod and thus do not readily melt.

Another method by which a dopant may be introduced into a semiconductor rod during the zone melting of the rod in a crucible-free process under an inert atmosphere is by passing a stream of a suitable gas charged with a dopant past the melting zone. This has the disadvantage that the gas stream necessarily flows past several zones of elevated temperature, some of which already contain dopant, with the result that the concentration of dopant in the rod can vary considerably along the rod axis. Moreover, when the desired dopant is boron or phosphorus, it is necessary to use diborane or phosphine, respectively, as the gas, both of which are dangerous substances.

A process is described in German Pat. No. 1,128,048, in which glass containing the dopant is fused onto the surface of a silicon rod, and the rod is subsequently subjected to a zone melting process during which the dopant diffuses into the silicon rod and the constituents of the glass are reduced and evaporate. However, in this process, the silicon rod becomes contaminated with oxygen and also with silicon dioxide particles if the reduction and evaporation are incomplete, and such particles can cause a high degree of dislocation in the rod.

Finally, from German Pat. 1,153,540, a process has become known, in which a thin semiconductor rod having a predetermined high concentration of dopant is produced and then further semiconductor material of the same type is deposited onto this rod in such an amount as to give a rod containing the desired lower concentration of dopant. The rod may then be subjected to a zone melting process in order to achieve a uniform distribution of the dopant.

It is a disadvantage of this process that it is necessary to keep considerable quantities of variously doped rods in stock so that these are available as required, since the production of such especially doped rods cannot be carried out at short notice during zone melting, but has to be prepared during the production of polycrystalline rods.

It is an object of the present invention to provide a process for doping semiconductor rods which avoids the shortcomings of known methods outlined above.

It is another object of the invention to provide a process of enabling the operator to control the amount and the type of dopant in a simple and effective manner.

Other objects and advantages of the process of the invention will become apparent from the following description and the accompanying drawings.

The present invention provides a process for doping a semiconductor rod, particularly a silicon rod, which comprises securing a semiconductor rod containing the desired amount of dopant and having a substantially smaller cross-section than the rod to be doped against that rod with the axes of the two rods substantially parallel to one another, fusing the two rods into a single rod and, subsequently, or simultaneously subjecting the rod so formed to a crucible-free zone melting process for obtaining uniform distribution of the dopant.

It is envisaged that the present process will generally be used for the doping of an undoped semiconductor rod and, more particularly, for the doping of a high-ohmic polycrystalline semiconductor rod which has been deposited from the gaseous phase onto an undoped support. In this case, the resistance of the doped rod produced according to the invention will be determined by the amount of dopant contained in the thin doped rod and by the diameter of the final rod formed after zone melting.

It is possible, however, to use the present process for altering the resistance of a semiconductor rod already containing dopant: for example, further dopant may be introduced into a polycrystalline rod which has been deposited from the gaseous phase onto a doped support, such as a thin doped rod. In this case, the dopant introduced according to the present process may be of the same type as the dopant already contained in the rod, the further dopant being introduced in order to lower the resistance of the rod. Alternatively, the dopant introduced according to the present process may be of a different type from that already contained in the rod: for example, a thin rod containing boron may be fused to an n-type polycrystalline rod which is then subjected to zone melting. The resistance of the final rod will depend both on the amount of dopant already present and the amount of dopant of a different type introduced. The amount of dopant introduced may merely be sufficient to compensate partially for dopant of a different type already present, in which case the final rod will have the same type of conductors as that of the initial rod, but at a higher resistance. Alternatively, the amount of dopant introduced may be sufficient to overcompensate for that already present, so that, for example, a p-type semiconductor rod may be produced from an n-type polycrystalline semiconductor rod.

The present process is thus suitable for the manufacture of semiconductor rods having the desired compensation, irrespective of the initial dopant content, if any, of the polycrystalline rod.

Any known dopant may, in principle, be introduced into a semiconductor rod according to the present process. Suitable p-type dopants are, for example, elements of Group III of the Periodic Table, for example, aluminum, gallium, indium and, especially, boron. Suitable n-type dopants are, for example, elements of Group V of the Periodic Table, for example, arsenic, antimony and, especially, phosphorus.

The thin semiconductor rod containing dopant may be a rod of square or rectangular cross-section sawn from a polycrystalline rod, or it may be a conventional thin rod of circular cross-section, suitably with a diameter of from 3 to 10 mm. A thin rod of circular cross-section may suitably be drawn from a thicker rod, as described in German Pat. No. 975 158, by continuously increasing the distance between the ends of a rod during a zone-melting process.

The thin semiconductor rod containing dopant may be secured to the rod to be doped in a variety of ways. One suitable method is to cut a groove to accommodate the thin rod longitudinally in the side of the rod to be doped. A method that has proved particularly suitable is to grind off a portion of the rod of segment-shaped cross-section along the length of the rod so as to leave a narrow flat longitudinal surface along one side of the rod. The thin doped rod may be tied longitudinally against this flat surface by means of a heat-resistant wire of a non-doping material or, preferably, carbon twine. It is usually sufficient to tie the two rods together toward only one end of the rods. If melting for fusion of the thin rod to the polycrystalline rod and zone melting is done in one operation, the tieing together should be at the end remote from the seed crystal.

The fusion of the two rods into a single rod may be effected in a conventional zone-melting apparatus by advancing an induction heating coil tangentially toward the side of the semiconductor rod to which the thin rod is secured. The induction heating coil used for this purpose, coaxially surrounding the semiconductor rod, is preferably one having a straight section diametrically opposite the position where the current supply lines enter and leave the coil. Advantageously, from 15 to 25% of the coil winding should lie along this straight section of the coil. Suitable coils are, for example, square or rectangular coils. The thin rod is of low resistance and couples up with the induction heating coil and fuses onto the semiconductor rod to be doped. Where this part is in contact with the thin rod, it is heated only by heat transfer from the thin rod and not directly by the coil. Moreover, because the induction coil asymmetrically surrounds the semiconductor rod to be doped in such a manner that it is closest to the rod at the desired place of fusion, the rod is heated to white heat only in this area, thus facilitating fusion of the two rods. Fusion may be effected, for example, at speeds of 10 mm/min or greater.

Especially in the case where the thin rod has been secured against a narrow flat surface of the rod to be doped as described above, the single rod resulting from fusion of the two rods is generally of substantially circular cross-section and without gaps or projecting edges. The rod may then be zone-melted according to a conventional process to give a monocrystalline rod. This may generally be effected without any difficulty resulting from the fusion of the two rods and without any dislocations in the monocrystalline rod.

In an alternative method of carrying out the present process, the zone-melting may be effected immediately after or practically simultaneously with the fusion in a one-step process by causing the rods to pass simultaneously through a first heating coil suitable for effecting the fusion and through a second heating coil suitable for effecting the zone-melting, in such a manner that each part of the rod passes first through the first coil and subsequently through the second coil, while rotating the rod. The desired passage of the rod through the coil may be achieved either by moving the rod through the stationary coils or by moving the coils along the rod held stationary in a longitudinal direction. In this case, any wire or twine used to secure the thin rod to the rod to be doped should be tied toward the end of the rods remote from the seed crystal, that is the end at which fusion is effected last.

The present process may by used for doping rods of various semiconductor materials, but is particularly suitable for doping silicon rods.

The present process can be carried out much more quickly than the process according to German Pat. No. 1,153,540 mentioned above. For the present process, it is necessary to keep stocks of the high-ohmic polycrystalline rods, but these are generally undoped and thus it is much simpler to keep stocks of these rods than to keep stocks of variously doped rods as was necessary according to the other process. The thin doped rods required in the present process can be produced relatively quickly, in a matter of hours, as compared to a rod produced by deposition from the gaseous phase, which takes a week or two.

Figure 2:
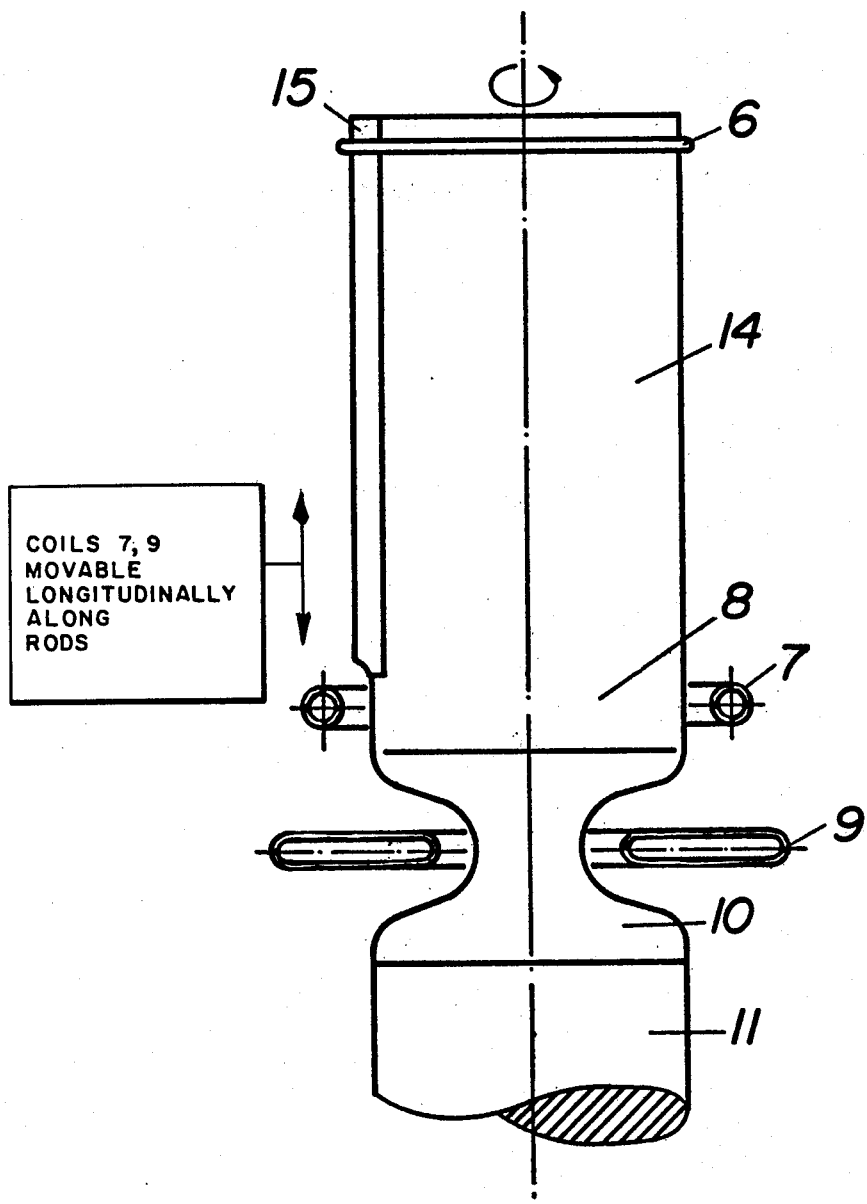

The present invention will now be described by way of example only with reference to the accompanying drawings in which FIG. 1 shows diagrammatically an end view of a semiconductor rod to be doped and a thin rod, surrounded by a heating coil, immediately prior to fusion, and FIG. 2 shows diagrammatically a front view of a semiconductor rod being drawn simultaneously through a first heating coil suitable for fusion and a second heating coil suitable for zone melting.

Referring now to FIG. 1, a square copper induction heating coil 2, having a hollow circular cross-section through which coolant is flowing, is placed around the two semiconductor rods 4 and 5; the current supply lines are designated by 1. Rod 4, which is to be doped, has a flat surface portion 3 and rod 5, which contains the dopant, is in abutting position thereto. The straight side 12, which is diametrically opposite the position where the current supply lines 1 enter and leave the coil, is closest to the thin rod 5, and 3–5 mm therefrom at the nearest point. Heat from the coil 2 fuses the two rods 4 and 5 together, as either the rod is pulled through the coil without rotation, or the coil is moved along the stationary rod, suitably at a speed of about 10 mm/min or more in each case.

Referring now to FIG. 2, rod 14 to be doped, with the thin rod 15 tied thereto, with a carbon twine 6 is rotated about its longitudinal axis while a circular coil 7 having a hollow circular cross-section through which coolant is flowing, is slowly passed upwardly along the length of the rod 14. Since rod 14 has a flat surface portion of about 1–2 mm depth at the area where thin rod 15 is placed, the combined rod after fusion will again have an approximately circular cross-section, shown at 8. Fusion is brought about by coil 7, whose electrical power is such that the thin rod 15, which easily couples up with the induction field because of its high dopant content and consequent low resistance, fuses onto the rod 14 to form the single rod of substantially circular cross-section mentioned above, without melting the rod 14 over its entire cross-section. A flat coil 9 of the type conventionally used for zone melting is situated a few centimeters below the coil 7 and is likewise moved slowly upward along the length of the rod 14, heating the rod so as to form a zone 10 of molten semiconductor material; both coils are then removed over the top of the rod, which solidifies to form a doped monocrystalline rod 11.

In order to manufacture, for example, a monocrystalline n-type silicon rod having a resistance of 2.0 to 2.5 ohm.cm from, for example, a polycrystalline rod having a diameter of 66 mm and a resistance of the order of 5000 ohm. cm held in stock, it is necessary, according to the present process, simply to fuse onto the polycrystalline rod a phosphorus-doped thin rod having a resistance of 0.038–0.043 ohm. cm and a diameter of, for example, 5 mm and to zone-melt the rod so formed subsequently or simultaneously. Even if the thin rod is not available in stock and has first to be drawn, the desired rod can still be produced within a few hours, as mentioned above, whereas a rod produced by deposition from the gaseous phase onto a doped support would take one or two weeks to be manufactured, depending on its length.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A process for doping a semiconductor rod, which comprises securing a semiconductor rod containing a dopant and having a substantially smaller cross-section than the rod to be doped against the rod to be doped with the axes of the two rods substantially parallel to one another, both rods consisting of the same semiconductor materials, fusing the two rods into a single rod, and subjecting the rod so formed to a crucible-free zone melting process.

2. The process as claimed in claim 1, wherein the rod to be doped has a narrow flat longitudinal surface portion and the dopant-containing rod is secured against this portion.

3. The process as claimed in claim 1 wherein the two rods are secured together by means of a heat-resistant wire of a non-doping material.

4. The process as claimed in claim 1, wherein fusion is effected by advancing an induction heating coil tangentially toward the side of the rod to be doped to which the dopant-containing rod is secured.

5. The process as claimed in claim 4, wherein the induction heating coil has a straight section diametrically opposite the position where current supply lines enter and leave the coil, and wherein this straight section is advanced toward the side of the rod to be doped.

6. The process as claimed in claim 5, wherein from 15 to 25% of the coil winding lies along the straight section.

7. The process as claimed in claim 1, wherein the rods are caused to pass simultaneously through a first heating coil suitable for effecting the fusion and through a second heating coil suitable for effecting the zone melting, in such a manner that each part of the rods passes first through the first coil and subsequently through the second coil, while rotating the rod to be doped about its longitudinal axis.

8. The process as claimed in claim 7, wherein the rods are held stationary in a longitudinal direction and the rods are caused to pass through the coils by moving the coils along the rods.

9. The process as claimed in claim 1, wherein the seiconductor rods are of silicon.

10. The process as claimed in claim 1, wherein the dopant is an element of Group III of the Periodic Table.

11. The process as claimed in claim 1, wherein the dopant is an element of Group V of the Periodic Table.

* * * * *

UNITED STATES PATENT OFFICE
CERTIFICATE OF CORRECTION

Patent No. 4,110,586　　　　　Dated August 29, 1978

Inventor(s) Köhl et al.

It is certified that error appears in the above-identified patent and that said Letters Patent are hereby corrected as shown below:

Column 2, line 47, delete "conductors" and substitute therefor -- conductance --.

Signed and Sealed this

*Thirteenth* Day of *March 1979*

[SEAL]

Attest:

RUTH C. MASON
*Attesting Officer*

DONALD W. BANNER
*Commissioner of Patents and Trademarks*